United States Patent
Hashim

(10) Patent No.: US 7,186,149 B2
(45) Date of Patent: Mar. 6, 2007

(54) COMMUNICATIONS CONNECTOR FOR IMPARTING ENHANCED CROSSTALK COMPENSATION BETWEEN CONDUCTORS

(75) Inventor: Amid Hashim, Plano, TX (US)

(73) Assignee: CommScope Solutions Properties, LLC, Sparks, NV (US)

( * ) Notice: Subject to any disclaimer, the term of this patent is extended or adjusted under 35 U.S.C. 154(b) by 0 days.

(21) Appl. No.: 11/230,442

(22) Filed: Sep. 20, 2005

(65) Prior Publication Data

US 2006/0121791 A1 Jun. 8, 2006

(51) Int. Cl.
*H01R 24/00* (2006.01)
*H01R 13/625* (2006.01)

(52) U.S. Cl. .................. 439/676; 439/941; 439/344

(58) Field of Classification Search ............... 439/676, 439/76.1, 344, 941
See application file for complete search history.

(56) References Cited

U.S. PATENT DOCUMENTS

| | | |
|---|---|---|
| 5,186,647 A | 2/1993 | Denkmann et al. |
| 5,299,956 A | 4/1994 | Brownell et al. |
| 5,310,363 A | 5/1994 | Brownell et al. |
| 5,326,284 A | 7/1994 | Bohbot et al. |
| 5,328,390 A | 7/1994 | Johnston et al. |
| 5,362,257 A | 11/1994 | Neal et al. |
| 5,397,862 A | 3/1995 | Bockelman et al. |
| 5,414,393 A | 5/1995 | Rose et al. |
| 5,432,484 A | 7/1995 | Klas et al. |
| 5,547,405 A | 8/1996 | Pinney et al. |

(Continued)

FOREIGN PATENT DOCUMENTS

EP 0 525 703 B1 2/1993

(Continued)

OTHER PUBLICATIONS

International Search Report and Written Opinion of the International Searching Authority for PCT Application No. PCT/US2005/043378 mailed on Apr. 19, 2006.

*Primary Examiner*—Hien Vu
(74) *Attorney, Agent, or Firm*—Myers Bigel Sibley & Sajovec

(57) ABSTRACT

A communications connector includes: a dielectric mounting substrate; at least four pairs of conductors mounted on the mounting substrate, each of the conductors including a free end segment, each of the free end segments being positioned in side-by-side and generally parallel relationship; and at least four pairs of terminals mounted on the mounting substrate, wherein each of the pairs of terminals is electrically connected to a respective pair of conductors. A first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs. Each of the first, second and fourth pairs of conductors includes a crossover between the conductors of the pairs, and the third pair of conductors includes three crossovers between its conductors.

22 Claims, 7 Drawing Sheets

U.S. PATENT DOCUMENTS

| | | |
|---|---|---|
| 5,571,035 A | 11/1996 | Ferrill |
| 5,587,884 A | 12/1996 | Raman |
| 5,618,185 A | 4/1997 | Aekins |
| 5,779,503 A | 7/1998 | Tremblay et al. |
| 5,911,602 A | 6/1999 | Vaden |
| 5,915,989 A | 6/1999 | Adriaenssens et al. |
| 5,921,818 A | 7/1999 | Larsen et al. |
| 5,947,772 A | 9/1999 | Arnett et al. |
| 5,961,354 A | 10/1999 | Hashim |
| 5,967,853 A | 10/1999 | Hashim |
| 5,971,813 A | 10/1999 | Kunz et al. |
| 5,975,919 A | 11/1999 | Arnett et al. |
| 5,989,071 A | 11/1999 | Larsen et al. |
| 5,997,358 A | 12/1999 | Adriaenssens et al. |
| 6,017,247 A | 1/2000 | Gwiazdowski |
| 6,042,427 A | 3/2000 | Adriaenssens et al. |
| 6,050,843 A | 4/2000 | Adriaenssens et al. |
| 6,102,730 A | 8/2000 | Kjeldahl et al. |
| 6,116,964 A | 9/2000 | Goodrich et al. |
| 6,120,330 A | 9/2000 | Gwiazdowski |
| 6,165,023 A | 12/2000 | Troutman et al. |
| 6,170,154 B1 | 1/2001 | Swarup |
| 6,186,834 B1 | 2/2001 | Arnett et al. |
| 6,196,880 B1 * | 3/2001 | Goodrich et al. ........... 439/676 |
| 6,238,235 B1 | 5/2001 | Shavit et al. |
| 6,270,358 B1 | 8/2001 | Nozick |
| 6,270,381 B1 | 8/2001 | Adriaenssens |
| 6,312,290 B1 * | 11/2001 | Belopolsky ................. 439/676 |
| 6,350,158 B1 | 2/2002 | Arnett et al. |
| 6,353,540 B1 | 3/2002 | Nartzuka et al. |
| 6,356,162 B1 | 3/2002 | Deflandre et al. |
| 6,364,694 B1 * | 4/2002 | Lien ........................... 439/489 |
| 6,379,157 B1 | 4/2002 | Curry et al. |
| 6,379,198 B1 | 4/2002 | Arnett et al. |
| 6,407,542 B1 | 6/2002 | Conte |
| 6,428,362 B1 | 8/2002 | Phommachanh |
| 6,443,776 B2 | 9/2002 | Reichle |
| 6,443,777 B1 | 9/2002 | McCurdy et al. |
| 6,454,541 B1 | 9/2002 | Ijiri et al. |
| 6,464,529 B1 | 10/2002 | Jensen et al. |
| 6,520,807 B2 | 2/2003 | Winings |
| 6,524,128 B2 | 2/2003 | Marowsky et al. |
| 6,530,810 B2 | 3/2003 | Goodrich |
| 6,558,204 B1 | 5/2003 | Weatherley |
| 6,558,207 B1 * | 5/2003 | Pepe et al. .................. 439/862 |
| 6,561,838 B1 | 5/2003 | Blichfeldt |
| 6,571,187 B1 | 5/2003 | Conte |
| 6,592,395 B2 | 7/2003 | Brown et al. |
| 6,647,357 B1 | 11/2003 | Conte |
| 6,716,964 B1 | 4/2004 | Chinnadurai |
| 6,764,348 B2 | 7/2004 | Han et al. |
| 6,811,442 B1 | 11/2004 | Lien et al. |
| 6,962,503 B2 | 11/2005 | Aekins |
| 2001/0018287 A1 | 8/2001 | Reichle |
| 2001/0021608 A1 | 9/2001 | Borbolla et al. |
| 2001/0048592 A1 | 12/2001 | Nimomiya |
| 2002/0088977 A1 | 7/2002 | Mori et al. |
| 2003/0129880 A1 * | 7/2003 | Arnett et al. ............... 439/676 |
| 2004/0002267 A1 | 1/2004 | Hatterscheid et al. |
| 2005/0254223 A1 | 11/2005 | Hashim |
| 2006/0121788 A1 | 6/2006 | Pharney |
| 2006/0121789 A1 | 6/2006 | Hashim |
| 2006/0160428 A1 | 7/2006 | Hashim |

FOREIGN PATENT DOCUMENTS

| | | |
|---|---|---|
| EP | 0 901 201 | 3/1999 |
| EP | 1 059 704 | 12/2000 |
| EP | 1 191 646 | 3/2002 |
| EP | 1 435 879 | 7/2004 |
| WO | WO 94/05092 | 3/1994 |
| WO | WO 99/53574 | 10/1999 |
| WO | WO 2003-019734 | 3/2003 |
| WO | WO 03/090322 | 10/2003 |

* cited by examiner

COMMUNICATIONS CONNECTOR FOR IMPARTING ENHANCED CROSSTALK COMPENSATION BETWEEN CONDUCTORS

FIELD OF THE INVENTION

The present invention relates generally to communication connectors and more particularly to near-end crosstalk (NEXT) and far-end crosstalk (FEXT) compensation in communication connectors.

BACKGROUND OF THE INVENTION

In an electrical communication system, it is sometimes advantageous to transmit information signals (video, audio, data) over a pair of wires (hereinafter "wire-pair" or "differential pair") rather than a single wire, wherein the transmitted signal comprises the voltage difference between the wires without regard to the absolute voltages present. Each wire in a wire-pair is susceptible to picking up electrical noise from sources such as lightning, automobile spark plugs, and radio stations, to name but a few. Because this type of noise is common to both wires within a pair, the differential signal is typically not disturbed. This is a fundamental reason for having closely spaced differential pairs.

Of greater concern, however, is the electrical noise that is picked up from nearby wires or pairs of wires that may extend in the same general direction for some distances and not cancel differentially on the victim pair. This is referred to as crosstalk. Particularly, in a communication system involving networked computers, channels are formed by cascading plugs, jacks and cable segments. In such channels, a modular plug often mates with a modular jack, and the proximities and routings of the electrical wires (conductors) and contacting structures within the jack and/or plug also can produce capacitive as well as inductive couplings that generate near-end crosstalk (NEXT) (i.e., the crosstalk measured at an input location corresponding to a source at the same location) as well as far-end crosstalk (FEXT) (i.e., the crosstalk measured at the output location corresponding to a source at the input location). Such crosstalks occur from closely-positioned wires over a short distance. In all of the above situations, undesirable signals are present on the electrical conductors that can interfere with the information signal. When the same noise signal is added to each wire in the wire-pair, the voltage difference between the wires will remain about the same and differential crosstalk is not induced, while at the same time the average voltage on the two wires with respect to ground reference is elevated and common mode crosstalk is induced. On the other hand, when an opposite but equal noise signal is added to each wire in the wire pair, the voltage difference between the wires will be elevated and differential crosstalk is induced, while the average voltage on the two wires with respect to ground reference is not elevated and common mode crosstalk is not induced.

U.S. Pat. No. 5,997,358 to Adriaenssens et al. (hereinafter "the '358 patent") describes a two-stage scheme for compensating differential to differential NEXT for a plug-jack combination (the entire contents of the '358 patent are hereby incorporated herein by reference, as are U.S. Pat. Nos. 5,915,989; 6,042,427; 6,050,843; and 6,270,381). Connectors described in the '358 patent can reduce the internal NEXT (original crosstalk) between the electrical wire pairs of a modular plug by adding a fabricated or artificial crosstalk, usually in the jack, at one or more stages, thereby canceling or reducing the overall crosstalk for the plug-jack combination. The fabricated crosstalk is referred to herein as a compensation crosstalk. This idea can often be implemented by twice crossing the path of one of the differential pairs within the connector relative to the path of another differential pair within the connector, thereby providing two stages of NEXT compensation. Another common technique is to cross the conductors of pairs 1, 2 and 4 (as defined in designation T568B of TIA-568-B.2) and leaving the conductors of pair 3 uncrossed (see, e.g., U.S. Pat. No. 5,186,647), then including a second compensation stage (e.g., in the form of a capacitor) on an attached printed wiring board. This scheme can be more efficient at reducing the NEXT than a scheme in which the compensation is added at a single stage, especially when the second and subsequent stages of compensation include a time delay that is selected to account for differences in phase between the offending and compensating crosstalk. This type of arrangement can include capacitive and/or inductive elements that introduce multi-stage crosstalk compensation, and is typically employed in jack lead frames and PWB structures within jacks. These configurations can allow connectors to meet "Category 6" performance standards set forth in ANSI/EIA/TIA 568B.2-1, which are primary component standards for mated plugs and jacks for transmission frequencies up to 250 MHz.

Alien NEXT is the differential crosstalk that occurs between communication channels. Obviously, physical separation between jacks will help and/or typical crosstalk approaches may be employed. However, a problem case may be "pair 3" of one channel crosstalking to "pair 3" of another channel, even if the pair 3 plug and jack wires in each channel are remote from each other and the only coupling occurs between the routed cabling. To reduce this form of alien NEXT, shielded systems containing shielded twisted pairs or foiled twisted pair configurations may be used. However, the inclusion of shields can increase cost of the system. Another approach to reduce or minimize alien NEXT utilizes spatial separation of cables within a channel and/or spatial separation between the jacks in a channel. However, this is typically impractical because bundling of cables and patch cords is common practice due to "real estate" constraints and ease of wire management.

In spite of recent strides made in improving mated connector (i.e., plug-jack) performance, and in particular reducing crosstalk at elevated frequencies (e.g., 500 MHz—see U.S. patent application Ser. No. 10/845,104, entitled NEXT HIGH FREQUENCY IMPROVEMENT BY USING FREQUENCY DEPENDENT EFFECTIVE CAPACITANCE, filed May 4, 2004, the disclosure of which is hereby incorporated herein by reference), channels utilizing connectors that rely on either these teachings or those of the '358 patent can still exhibit unacceptably high alien NEXT at very high frequencies (e.g., 500 MHz). As such, it would be desirable to provide connectors and channels used thereby with reduced alien NEXT at very high frequencies.

One solution is offered in co-pending and co-assigned U.S. patent application Ser. No. 11/044,088 (the '088 application), filed Mar. 25, 2005, the disclosure of which is hereby incorporated herein. The '088 application proposes to reduce the conversion of differential to common mode crosstalk by eliminating crossovers between pairs 1, 2 and 4 of the conductors of a connector and introducing a crossover only in pair 3. This solution can reduce the conversion of differential to common mode crosstalk considerably. However, such an arrangement may fail to compensate for common mode crosstalk induced on pair 3 when either of pairs 2 or 4 is differentially excited, and further may fail to compensate for differential to common mode crosstalk between pairs 1 and 2 and pairs 1 and 4. Moreover, the open loop configurations of pairs 1, 2 and 4 can generate and render the connector susceptible to electromagnetic interference.

SUMMARY OF THE INVENTION

The present invention can provide communications jacks with improved differential to common mode and differential to differential NEXT and FEXT performance, particularly at high frequencies. As a first aspect, embodiments of the present invention are directed to a communications connector, comprising: a dielectric mounting substrate; at least four pairs of conductors mounted on the mounting substrate, each of the conductors including a free end segment, each of the free end segments being positioned in side-by-side and generally parallel relationship; and at least four pairs of terminals mounted on the mounting substrate, wherein each of the pairs of terminals is electrically connected to a respective pair of conductors. A first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs. Each of the first, second and fourth pairs of conductors includes a crossover between the conductors of the pairs, and the third pair of conductors includes three crossovers between its conductors.

As a second aspect, embodiments of the present invention are directed to a communications connector, comprising: a dielectric mounting substrate; at least four pairs of conductors mounted on the mounting substrate, each of the conductors including a free end segment, each of the free end segments being positioned in side-by-side and generally parallel relationship; and at least four pairs of terminals mounted on the mounting substrate, wherein each of the pairs of terminals is electrically connected to a respective pair of conductors. A first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free ends of the third pair being disposed between the first and second pairs, and the other of the conductor free end segments being disposed between the first and fourth pairs. The connector further comprises a wiring board positioned between the free end segments of the conductors and fixed end segments of the conductors mounted in the mounting substrate, the wiring board being generally perpendicular to the conductors, wherein the wiring board includes conductive traces that electrically connect the free end and fixed end segments of each of the conductors. The third pair of conductors forms a crossover on the wiring board, the first, second and fourth pairs of conductors include a crossover, and the third pair of conductors includes two additional crossovers.

As a third aspect, embodiments of the present invention are directed to a communications connector, comprising: a dielectric mounting substrate; at least four pairs of conductors mounted on the mounting substrate, each of the conductors including a free end segment, each of the free end segments being positioned in side-by-side and generally parallel relationship; and at least four pairs of terminals mounted on the mounting substrate, wherein each of the pairs of terminals is electrically connected to a respective pair of conductors. A first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs. The conductors define first, second, third and fourth coupling regions. The number of the first, second, third and fourth regions having positive differential to differential coupling equals the number of first, second, third and fourth regions having negative differential to differential coupling between the third pair and any of the first, second and fourth pairs. The number of first, second, third and fourth regions having positive differential to common mode coupling equals the number of first, second, third and fourth regions having negative differential to common mode coupling between any two of the four pairs. The third pair of conductors reverses polarity between the second and third regions.

As a fourth aspect, embodiments of the present invention are directed to a communications connector, comprising: a dielectric mounting substrate; at least four pairs of conductors mounted on the mounting substrate, each of the conductors including a free end segment, each of the free end segments being positioned in side-by-side and generally parallel relationship; and at least four pairs of terminals mounted on the mounting substrate, wherein each of the pairs of terminals is electrically connected to a respective pair of conductors. A first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs. The conductors define first, second, third and fourth coupling regions. The number of the first, second, third and fourth regions having positive differential to differential coupling equals the number of first, second, third and fourth regions having negative differential to differential coupling. The differential to differential coupling polarity of the first and fourth regions is identical and the differential to differential coupling polarity of the second and third regions is identical between the third pair and any of the first, second and fourth regions. The number of first, second, third and fourth regions having positive differential to common mode coupling equals the number of first, second, third and fourth regions having negative differential to common mode coupling between any two of the four pairs.

DETAILED DESCRIPTION OF EMBODIMENTS OF THE INVENTION

Figure 1:
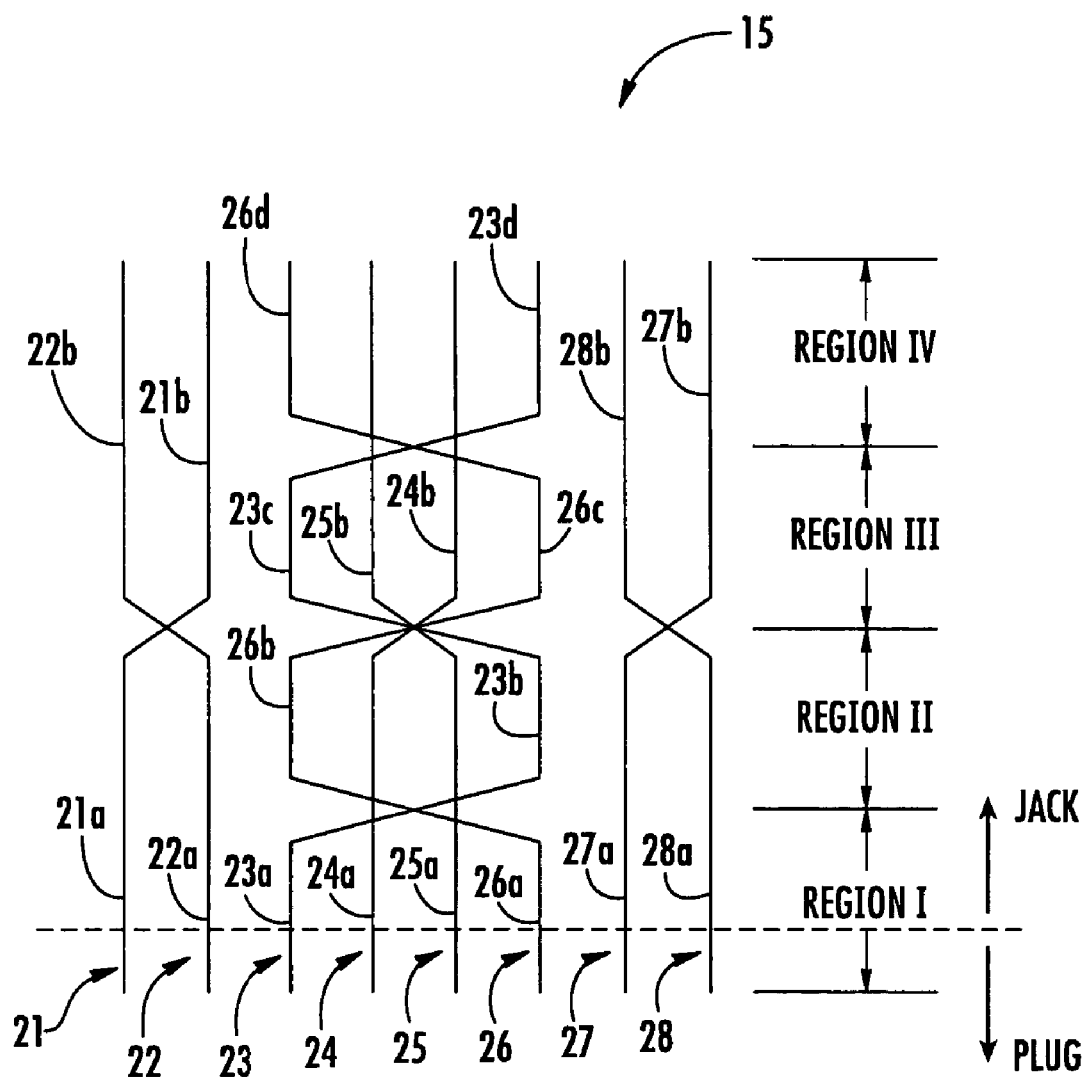
FIG. 1 is a top schematic view of an arrangement of conductors of an embodiment of a communications jack according to the present invention.

The present invention will be described more particularly hereinafter with reference to the accompanying drawings. The invention is not intended to be limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

This invention is directed to communications connectors, with a primary example of such being a communications jack. As used herein, the terms "forward", "forwardly", and "front" and derivatives thereof refer to the direction defined by a vector extending from the center of the jack toward the plug opening of the jack. Conversely, the terms "rearward", "rearwardly", and derivatives thereof refer to the direction directly opposite the forward direction; the rearward direction is defined by a vector that extends away from the plug opening toward the remainder of the jack. The terms "lateral," "laterally", and derivatives thereof refer to the direction generally parallel with the plane defined by a wiring board on which jack contact wires are mounted and extending away from a plane bisecting the plug in the center. The terms "medial," "inward," "inboard," and derivatives thereof refer to the direction that is the converse of the lateral direction, i.e., the direction parallel with the plane defined by the wiring board and extending from the periphery of the jack toward the aforementioned bisecting plane. Where used, the terms "attached", "connected", "interconnected", "contacting", "mounted" and the like can mean either direct or indirect attachment or contact between elements, unless stated otherwise. Where used, the terms "coupled," "induced" and the like can mean non-conductive interaction, either direct or indirect, between elements or between different sections of the same element, unless stated otherwise.

Referring now to the figures, an arrangement of conductors, designated broadly at 15, is illustrated in FIG. 1. Eight conductors 21–28 are illustrated therein, and are paired according to the designation T568B set forth in TIA-568-B.2, with the conductors of pair 1 (conductors 24 and 25) being adjacent to each other and in the center of the arrangement, the conductors of pair 2 (conductors 27 and 28) being adjacent to each other and occupying the rightmost two positions (from the vantage point of FIG. 1) in the sequence, the conductors of pair 4 (conductors 21 and 22) being adjacent to each other and occupying the leftmost two positions (from the vantage point of FIG. 1) in the sequence, and the conductors of pair 3 (conductors 23 and 26) being positioned between, respectively, pairs 1 and 4 and pairs 1 and 2.

As illustrated in FIG. 1, the conductors of each of the pairs 1, 2 and 4 "crossover" (i.e., switch paths in a non-contacting fashion) each other once in extending from the near end (where the connector mates with a mating connector) and the far end (where individual wires are connected with each conductor), and the conductors of pair 3 cross over each other thrice. The crossovers take place at three locations, the first being a first pair 3 crossover, the second encompassing a crossover of each of the pairs 1–4, and the third being a third pair 3 crossover, thus dividing the conductor arrangement 15 into four coupling regions, designated as regions I–IV. Typically, Region I spans the plug and the jack, accounting for the residual crosstalk from the plug in addition to the crosstalk generated in the portion of the jack contacts ahead of the first crossover location. Regions II–IV typically reside in the jack only, providing compensation that can counteract or substantially cancel the crosstalk from region I. Particularly efficient cancellation may be achieved when the amounts of coupling between the regions I–IV are made essentially equal to each other. The amount of coupling in each region is typically directly proportional to its length and inversely proportional to the spacing between its conductors, and can be thus controlled. It is also directly proportional to the dielectric constant or the magnetic permeability of the medium in which the conductors reside, and can also be thus controlled.

Referring again to FIG. 1, in a first region I, segments 21a–28a of all of the conductors travel along their original paths. As they approach a region II, the segments 21a, 22a, 24a, 25a, 27a, 28a of the conductors of pairs 4, 1 and 2 continue to travel along their original paths, while the segments 23a, 26a of pair 3 cross over and merge with segments 23b, 26b. As the conductors reach a region III, the segments 23b, 26b of pair 3 cross over each other to merge with segments 23c, 26c, while the segments 21a, 22a, 24a, 25a, 27a, 28a of pairs 4, 1 and 2 cross over each other to merge with segments 21b, 22b, 24b, 25b, 27b, 28b. Finally, as the conductors reach a region IV, the segments 21b, 22b, 24b, 25b, 27b, 28b of pairs 4, 1 and 2 continue without crossing over each other, while the segments 23c, 26c of pair 3 cross over each other to merge with segments 23d, 26d. Thus, each of the conductors 21 and 22 of pair 4, conductors 24 and 25 of pair 1, and conductors 27 and 28 of pair 2 cross over each other once, while the conductors 23, 26 of pair 3 cross over each other thrice.

For the differential to differential crosstalk on a particular pair combination to cancel, the number of regions having positive differential to differential coupling should equal the number of regions having negative differential to differential coupling. Further, it may be advantageous if the differential to differential coupling polarities of regions I and IV are identical and the differential to differential coupling polarities of regions II and III are identical, thus implementing a highly efficient differential to differential two-stage compensation scheme such as that described in U.S. Pat. No. 5,997,358 to Adriaenssens et al. The polarity of the differential to differential coupling between two pairs changes when one and only one of the two pairs experiences a crossover. As shown in Table I, the arrangement of FIG. 1 can achieve two-stage compensation for the differential to differential crosstalks between pair 3 and each of the other pairs.

TABLE I

Differential to Differential Coupling Polarities

|  | Region I | Region II | Region III | Region IV |
| --- | --- | --- | --- | --- |
| Pair 1-Pair 2 | positive | positive | positive | positive |
| Pair 1-Pair 3 | negative | positive | positive | negative |
| Pair 1-Pair 4 | positive | positive | positive | positive |
| Pair 2-Pair 3 | negative | positive | positive | negative |
| Pair 2-Pair 4 | negative | negative | negative | negative |
| Pair 3-Pair 4 | negative | positive | positive | negative |

For the differential to common mode crosstalk to be canceled, the number of regions having positive differential to common mode coupling should equal the number of regions having negative differential to common mode coupling. The polarity of the differential to common mode coupling from a driven pair to a victim pair changes when the differentially driven pair experiences a crossover, regardless of whether the victim pair experiences a crossover or not.

As shown in Table II, this arrangement of conductors can reciprocally compensate the differential to common mode crosstalk for all pair combinations. For example, differential to common mode crosstalks between (a) pair 1 and pair 2 and vice versa and (b) pair 1 and pair 4 and vice versa are compensated by the crossovers present in these pairs. Also, common mode crosstalk induced on all of the other pairs by pair 3 can be compensated by the triple crossovers in pair 3.

TABLE II

Differential to Common Mode Coupling Polarities

|  | Region I | Region II | Region III | Region IV |
| --- | --- | --- | --- | --- |
| Pair 1-Pair 1 | positive | positive | negative | negative |
| Pair 1-Pair 2 | negative | negative | positive | positive |
| Pair 1-Pair 3 | negative | negative | positive | positive |
| Pair 1-Pair 4 | positive | positive | negative | negative |
| Pair 2-Pair 1 | negative | negative | positive | positive |
| Pair 2-Pair 2 | negative | negative | positive | positive |
| Pair 2-Pair 3 | negative | negative | positive | positive |
| Pair 2-Pair 4 | negative | negative | positive | positive |
| Pair 3-Pair 1 | positive | negative | positive | negative |
| Pair 3-Pair 2 | positive | negative | positive | negative |
| Pair 3-Pair 3 | negative | positive | negative | positive |
| Pair 3-Pair 4 | negative | positive | negative | positive |
| Pair 4-Pair 1 | positive | positive | negative | negative |
| Pair 4-Pair 2 | positive | positive | negative | negative |
| Pair 4-Pair 3 | positive | positive | negative | negative |
| Pair 4-Pair 4 | positive | positive | negative | negative |

Moreover, the cancellation of differential to common mode crosstalk from each of the four pairs unto itself (e.g., pair 1-pair 1, pair 2-pair 2) can reduce the generation of and susceptibility to electromagnetic interference.

Those skilled in this art will appreciate that the conductors may take many forms, including contact wires, leadframe structures, traces on a wiring board, and combinations of such components. Examples of conductors, and particularly combinations of components that form conductors, are described below. Other forms of conductors may also be employed. Also, the "crossovers" of the conductors can be achieved via techniques known to those skilled in this art, such as (a) contact wires and leadframe structures physically crossing one another in a non-contacting manner, such that a portion of one conductor of a pair prior to a crossover is aligned with a portion of the other conductor of the pair after the crossover and (b) conductive traces crossing paths on different layers of a wiring board, whether that board is the "main" board into which output terminals mount or an auxiliary board between the free and fixed ends of contact wires, as described below.

Figure 2:
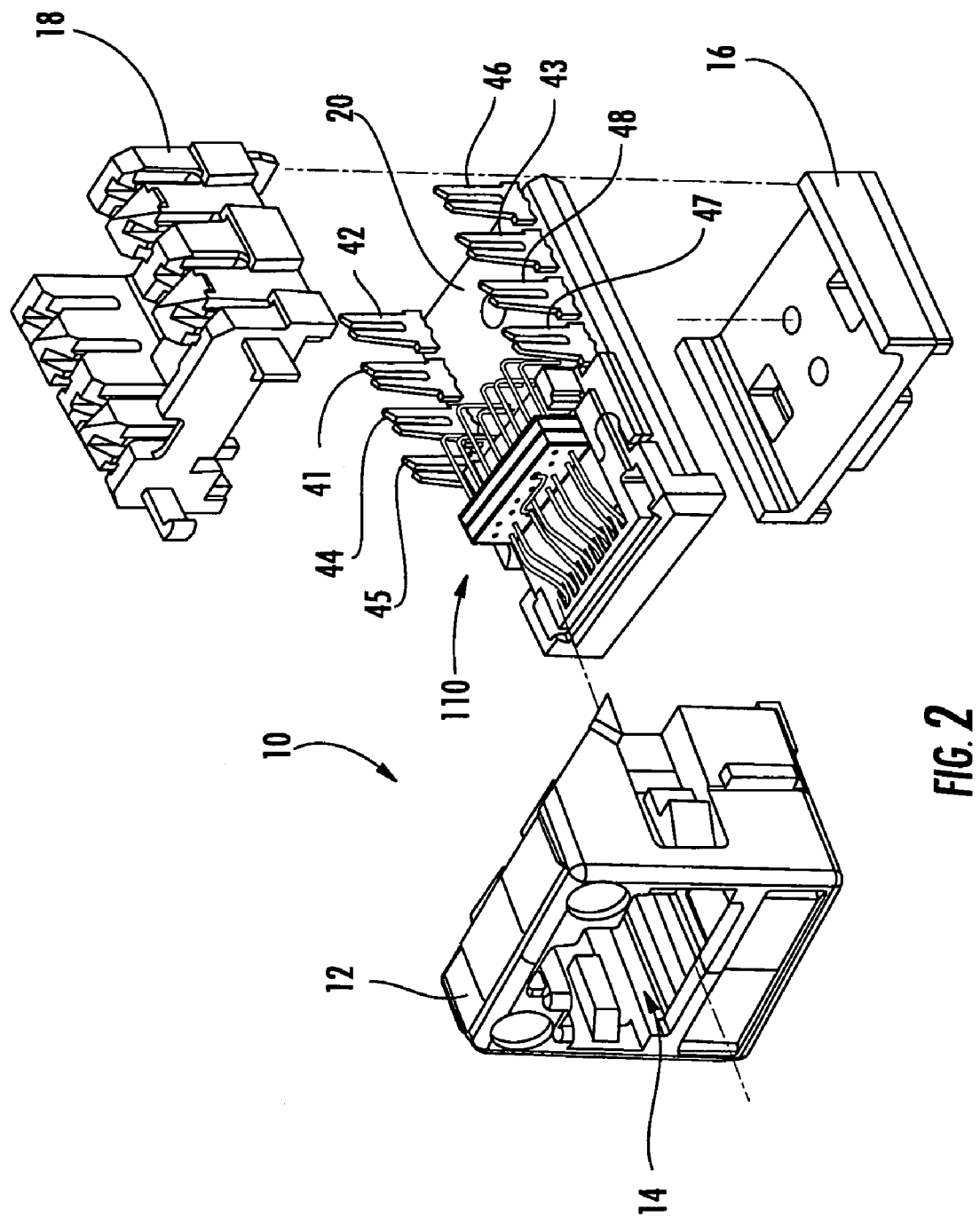
FIG. 2 is a perspective view of a communications jack that includes the conductors of FIG. 1 according to embodiments of the present invention.

An exemplary implementation of this concept in a communications jack is illustrated in FIGS. 2–7. Referring first to FIG. 2, the jack 10 includes a jack frame 12 having a plug aperture 14 for receiving a mating plug, a cover 16 and a terminal housing 18. These components are conventionally formed and not need be described in detail herein; for a further description of these components and the manner in which they interconnect, see U.S. Pat. No. 6,350,158 to Arnett et al., the disclosure of which is hereby incorporated herein in its entirety. Those skilled in this art will recognize that other configurations of jack frames, covers and terminal housings may also be employed with the present invention. Exemplary configurations are illustrated in U.S. Pat. Nos. 5,975,919 and 5,947,772 to Arnett et al. and U.S. Pat. No. 6,464,541 to Hashim et al., the disclosure of each of which is hereby incorporated herein in its entirety.

Figure 3:
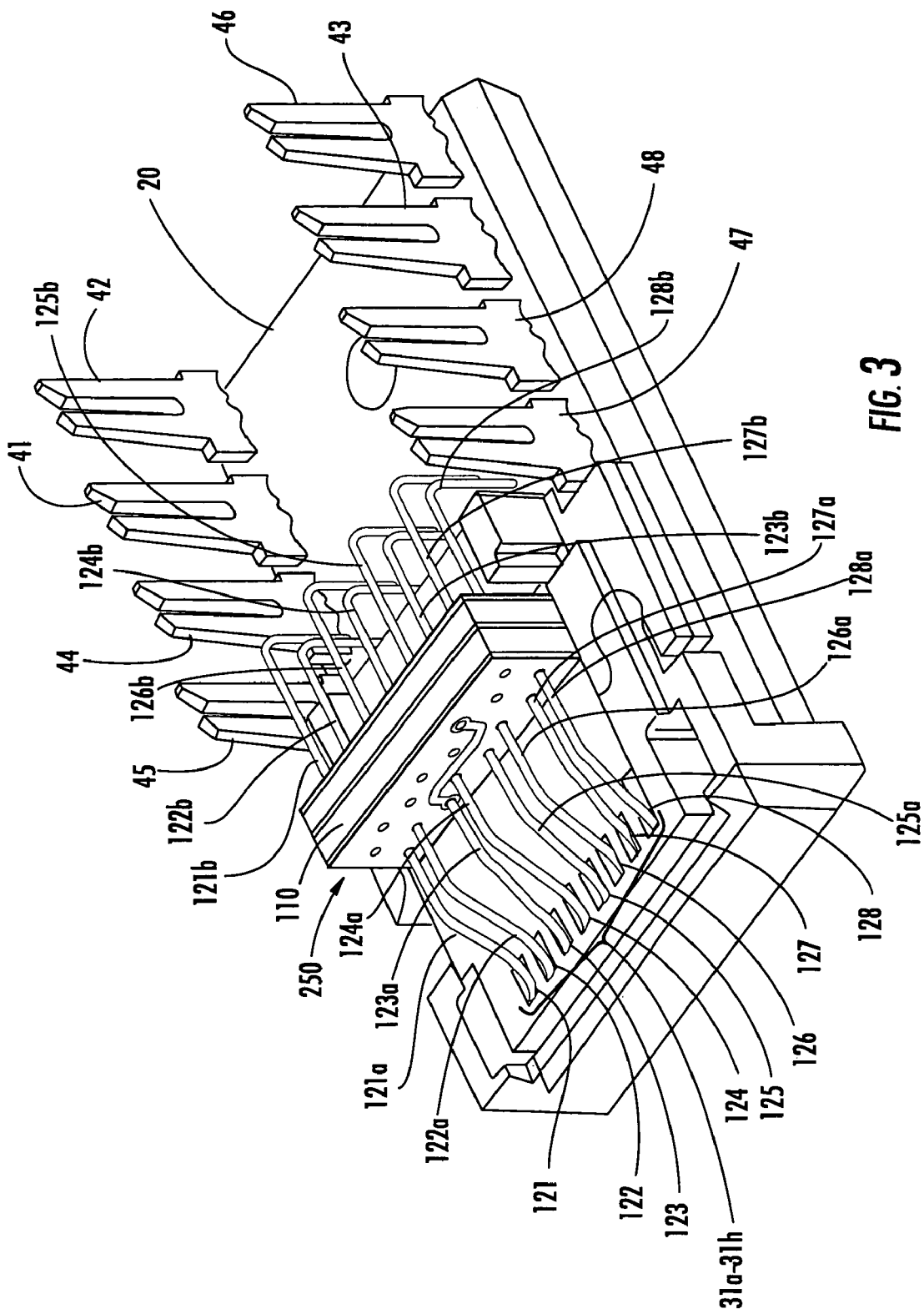
FIG. 3 is an enlarged perspective view of the wiring boards and conductors of the communications jack of FIG. 2.
Figure 5:
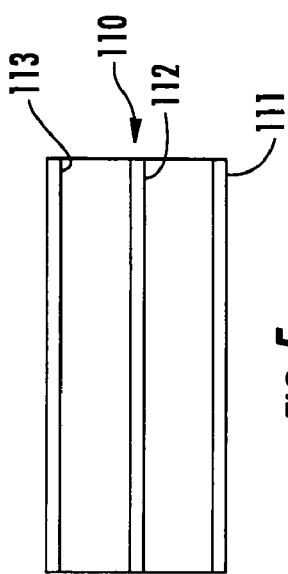
FIG. 5 is a top view of the floating PWB of FIG. 3 showing the conductive and insulative layers.
Figure 4:
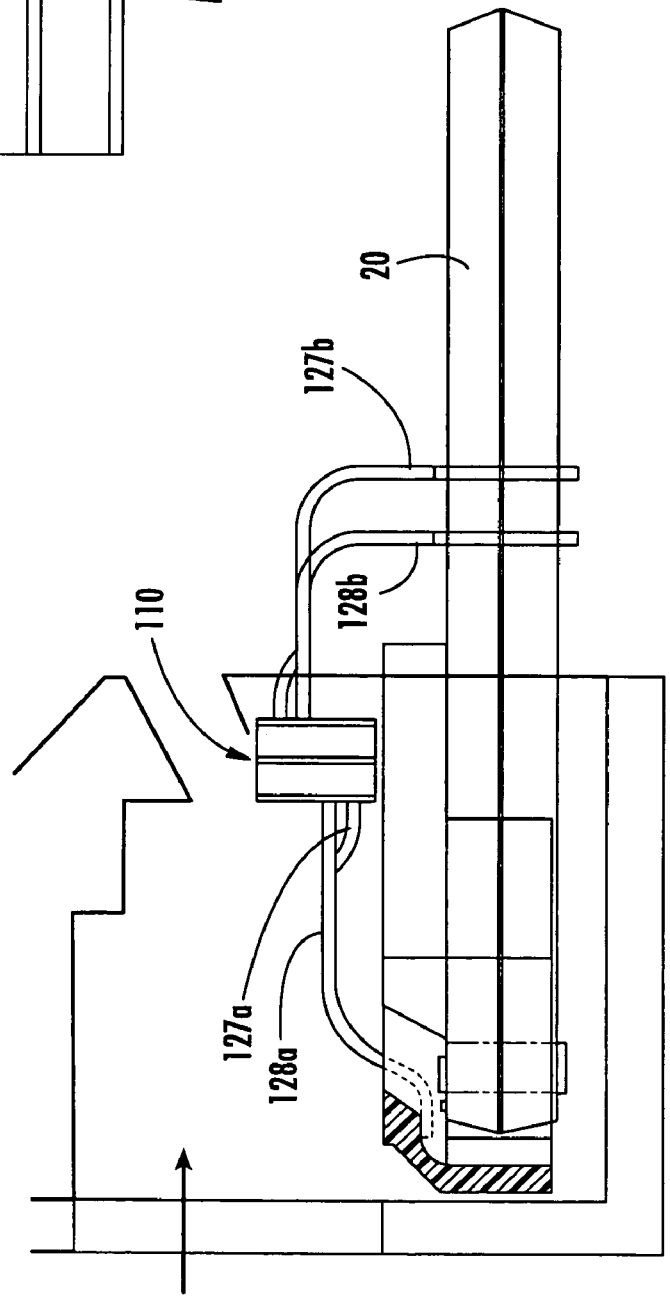
FIG. 4 is a side view of the wiring boards and conductors of FIG. 3.
Figure 7:
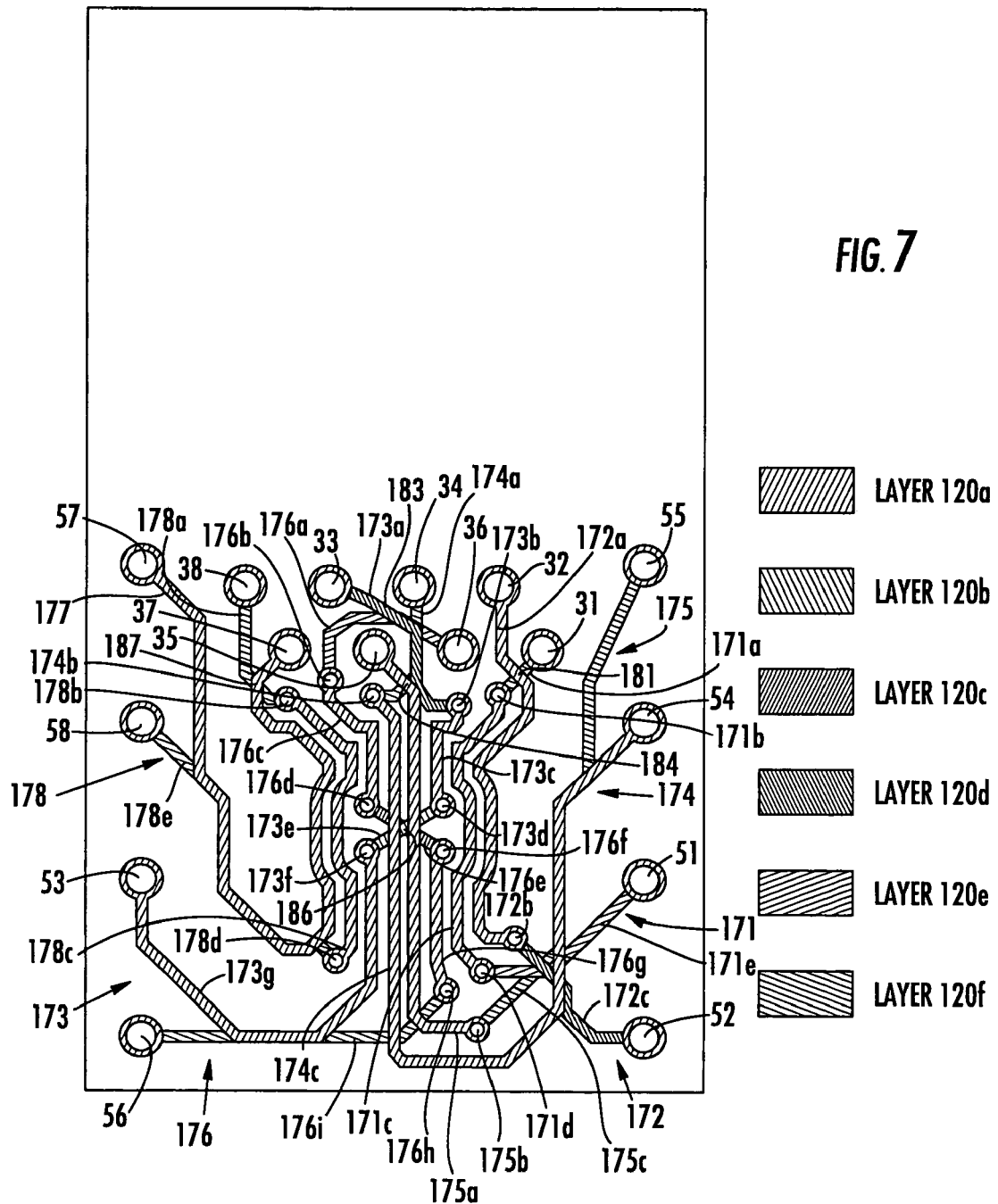
FIG. 7 is a top view of the overlying layers of the wiring board and traces deposited thereon of the jack of FIG. 2.

In addition, referring still to FIG. 2 and also to FIGS. 3, 4 and 7, the jack 10 further includes a wiring board 20 or other dielectric mounting substrate formed of conventional materials. The wiring board 20 may be a single layer board or may have multiple layers. The wiring board 20 may be substantially planar as illustrated, or may be non-planar. The wiring board 20 serves as a mounting location for eight conductors 121–128, which are described in greater detail below. In the illustrated embodiment, the conductors 121–128 include contact wires with free end segments 121a–128a and fixed end segments 121b–128b, and further include conductive traces 171–178, each of which are described in greater detail below. A printed wiring board (PWB) 110, also discussed in greater detail below, is suspended from the free end segments 121a–128a and the fixed end segments 121b–128b. The fixed end segments 121b–128b are mounted to the wiring board 20 via insertion into apertures 31–38 (see FIG. 7), which are arranged in the illustrated embodiment in a staggered pattern known to those skilled in this art as described in U.S. Pat. No. 6,116,964 to Goodrich et al., the disclosure of which is hereby incorporated herein in its entirety. Those skilled in this art will appreciate that conductors of other configurations may be used. As one example, contact wires configured as described in aforementioned U.S. Pat. No. 5,975,919 to Arnett et al. may be employed.

Referring once again to FIGS. 2, 3 and 7, eight insulation displacement connectors (IDCs) 41–48 are inserted into eight respective IDC apertures 51–58 on the wiring board 20. The IDCs are of conventional construction and need not be described in detail herein; exemplary IDCs are illustrated and described in U.S. Pat. No. 5,975,919 to Arnett, the disclosure of which is hereby incorporated by reference herein in its entirety. Although IDCs are illustrated herein, other varieties of terminals instead may be employed.

Referring again to FIG. 7, each of the wire apertures 31–38 is electrically connected to a one of the IDC apertures 51–58 via one of the traces 171–178, thereby interconnecting each of the conductors 121–128 to a corresponding IDC 41–48. The traces 171–178 are formed of conventional conductive materials and are deposited on the wiring board 20 via any deposition method known to those skilled in this art to be suitable for the application of conductors. Some traces are illustrated as being entirely present on a single layer of the wiring board 20 (for example, trace 177), while other traces (for example, trace 173) may reside on multiple layers of the wiring board 20; traces can travel between layers through the inclusion of vias (also known as plated through-holes) or other layer-transferring structures known to those skilled in this art. The traces 171–178 are described in much greater detail below.

Referring now to FIGS. 3 and 4, as noted above each of the conductors 121–128 includes a free end segment 121a–128a and a fixed end segment 121b–128b. The free end segments 121a–128a are generally parallel in profile, are substantially transversely aligned in side-by-side relationship, and extend into the plug aperture 14 to form electrical contact with the terminal blades of a mating plug. As used herein, "generally parallel" with reference to the free end portions means that, from the vantage point of FIG. 4, substantial portions of the free end portions are parallel to one another. The ends of the free end segments 121a–128a extend into individual slots 31a–31h in the vicinity of the forward edge portion of the wiring board 20 and extend rearwardly to mount in the front surface of the PWB 110. As stated above, the fixed end segments 121b–128b extend from the rear surface of the PWB 110 to insert into respective apertures 31–38 in the wiring board 20 (shown in FIG. 7). The fixed end segments may be aligned or non-aligned with their corresponding free end segments. Conductors that are "aligned" have free and fixed ends that are substantially collinear in top view (i.e., from the vantage point of FIG. 1), and conductors that are "non-aligned" have free and fixed ends that are not substantially collinear in top view.

Referring again to FIGS. 3 and 4, the PWB 110 is disposed above the upper surface of the wiring board 20. The PWB 110 can be rigid or flexible and is typically formed of a dielectric material. The PWB 110 is suspended above the wiring board 20 by the conductors 121–128 and is generally perpendicular to the wiring board 20 and the conductors 121–128. In the illustrated embodiment, the lower edge of the PWB 110 is spaced apart from the upper surface of the wiring board 20, such that the PWB 110 is free to move upon deflection of the conductors 121–128 (as when a mating plug is inserted into the jack 10), although in some embodiments the lower edge of the PWB 110 may contact the wiring board 20, or may extend downwardly into an aperture located in the wiring board. The distance between the PWB 110 and the locations where the conductors 121–128 intercept a mating plug is about 0.154 inches, but those skilled in this art will appreciate that a different distance may also be suitable with the present invention. Typically the PWB 110 is positioned between about 0.3 and 0.4 inches from the free ends of the conductors 121–128.

Figure 6:
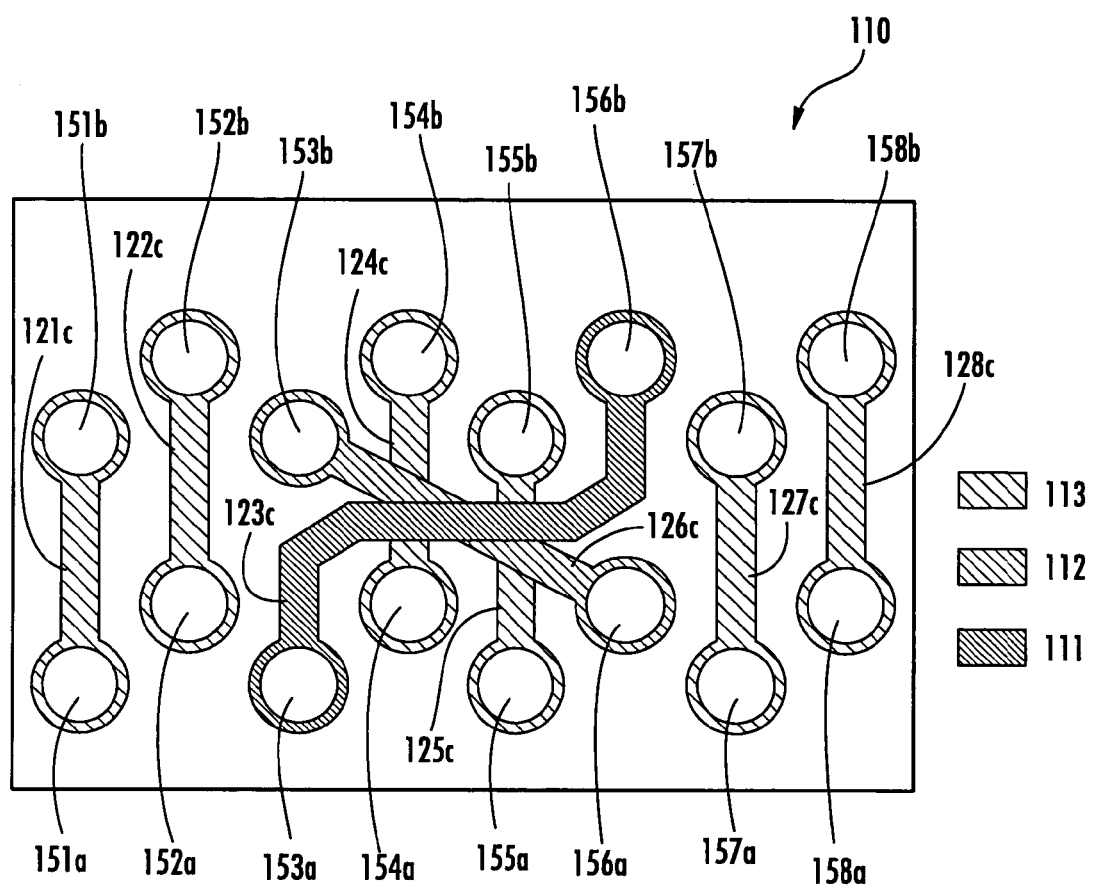
FIG. 6 is a front view of the overlying layers of the floating PWB of the jack of FIG. 2.

Referring to FIG. 6, the PWB 110 includes three layers 111–113 on which conductive traces are deposited. Also, the PWB 110 includes sixteen bores 151a–158a, 151b–158b arranged in two staggered rows. The free end segments 121a–128a of the conductors 121–128 are inserted into, respectively, the bores 151a–158a. Fixed end segments 121b, 122b, 124b, 125b, 127b, 128b are inserted into bores 151b, 152b, 154b, 155b, 157b, 158b, respectively. Fixed end segments 123b, 126b are inserted into bores 156b, 153b, respectively. The fixed end segments 121b–128b are then mounted on the wiring board 20 in respective apertures 31–38.

As can be seen in FIG. 6, the layer 111 of the PWB 110 includes a trace 123c that is routed between the bores 153a and 156b. The layer 112 of the PWB 110 includes a trace 126c that is routed between the bores 156a and 153b. Thus, a crossover in the conductors 123, 126 of pair 3 is created by the traces 123c, 126c that corresponds to the crossover in FIG. 1 between regions I and II.

In addition, on layer 113 of the PWB 110, six traces 121c, 122c, 124c, 125c, 127c, 128c extend between, respectively, the bores 151a, 152a, 154a, 155a, 157a, 158a and the bores 151b, 152b, 154b, 155b, 157b, 158b. These traces connect the free end segments 121a, 122a, 124a, 125a, 127a, 128a with the fixed end segments 121b, 122b, 124b, 125b, 127b, 128b of the conductors 121, 122, 124, 125, 127, 128. The fixed end segments 121b–128b converge into a co-planar geometry, thus forming region II of FIG. 1.

Figure 8:
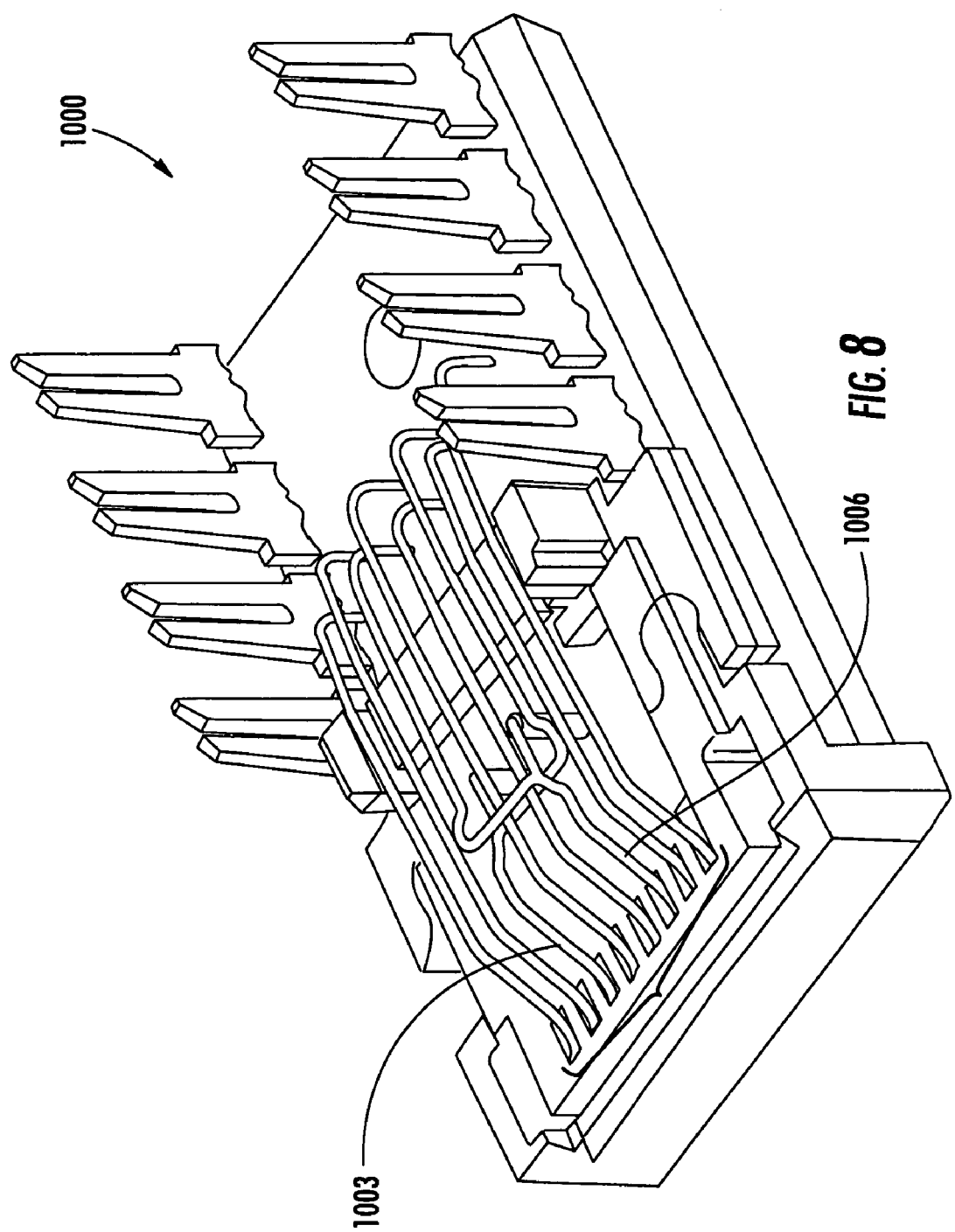
FIG. 8 is an isometric view of a communications jack according to an alternative configuration of the jack of FIG. 2.

An alternative configuration for providing the pair 3 crossover between regions I and II is shown in FIG. 8. In this method, the pair 3 conductors 1003, 1006 of jack 1000 are physically crossed in lieu of using a floating PWB in a manner similar to the embodiments of co-pending and co-assigned U.S. patent application Ser. No. 11/044,088 (the '088 application), filed Mar. 25, 2005, the disclosure of which is hereby incorporated herein in its entirety.

Referring now to FIG. 7, the wiring board 20 includes six overlying layers 120a–120f, on which the conductive traces 171-178 of the conductors 121–128 are deposited. Beginning with the traces 177, 178 of pair 2, a conductive trace 178a is located on layer 120f and extends away from aperture 38 to a via 178b. A trace 178c is located on layer 120a and extends between the via 178b and another via 178*d*. A trace 178*e* extends from the via 178*d* to the aperture 58, in which the IDC 48 is mounted. Thus, the traces 178*a*, 178*c*, 178*e* and the vias 178*b*, 178*d* connect the fixed end segment 128*b* (and, in turn, the entirety of the conductor 128) to the IDC 48. In addition, a conductive trace 177 follows a serpentine path in traveling between the aperture 37, in which the fixed end segment 127*b* is mounted, and the aperture 57, in which the IDC 47 is mounted. Notably, the trace 177 crosses above the trace 178*a* at a crossover 187, thereby creating the crossover between the conductors 127, 128 of pair 2 between regions II and III illustrated in FIG. 1.

Turning next to the traces 174, 175 of pair 1, a trace 175*a* is located on layer 120*a* and extends from aperture 35 to a via 175*b*. A trace 175*c* located on layer 120*f* travels from the via 175*b* to the aperture 55 that serves as a mounting location for the IDC 45. Thus, the traces 175*a*, 175*c* and the via 175*b* combine to connect the fixed end segment 125*b* of the conductor 125 to the IDC 45. A trace 174*a* is located on layer 120*f* and travels from the aperture 34 to a via 174*b*; in doing so, the trace 174*a* passes below (and therefore forms a crossover 184 with) the trace 175*a*. A serpentine trace 174*c* is routed from the via 174*b* to the aperture 54 in which the IDC 44 is mounted. The crossover 184 corresponds to the crossover of the conductors of pair 1 between regions II and III shown in FIG. 1.

Following now the traces of pair 4, a trace 172*a* on layer 120*a* extends from the aperture 32 to a via 172*b*. A trace 172*c* located on the layer 120*d* extends from the via 172*b* to the aperture 52, in which the IDC 42 is mounted. As a result, the fixed end segment 122*b* (and in turn the entirety of the conductor 122) is connected with the IDC 42. Also, a trace 171*a* extends from the aperture 31 to a via 171*b*; in following this path, the trace 171*a* passes under the trace 172*a*, thereby forming a crossover 181 that corresponds to the crossover of the conductors of pair 4 between regions II and III shown in FIG. 1. A trace 171*c* located on layer 120*a* is routed from the via 171*b* to another via 171*d*. Another trace 171*e* is located on layer 120*e* and travels between the via 171*d* and the aperture 51 in which the IDC 41 is mounted. Thus, the traces 171*a*, 171*c*, 171*e* and the vias 171*b*, 171*d* connect the fixed end segment 121*b* of the conductor 121 to the IDC 41.

Finally, turning to the traces 173, 176 of pair 3, a trace 173*a* located on the layer 120*d* extends between the aperture 33 and a via 173*b*. A trace 173*c* located on the layer 120*a* extends between the via 173*b* and a via 173*d*. A trace 173*e* located on the layer 120*b* extends between the via 173*d* and a via 173*f* and, in doing so, passes below the traces 174*c* and 175*a* of the conductors 174, 175 of pair 1. A trace 173*g* located on layer 120*a* extends between the via 173*f* and the aperture 53, in which the IDC 43 is mounted. Thus, the fixed end segment 123*b* of the conductor 123 is connected with the IDC 43 via the traces 173*a*, 173*c*, 173*e*, 173*g* and the vias 173*b*, 173*d*, 173*f*. A trace 176*a* located on the layer 120*e* extends from the aperture 36 to a via 176*b*; in doing so, the trace 176*a* forms a crossover 183 with the trace 173*a* of the conductor 123. Thus, the traces 173, 176 (and, in turn, the conductors 123, 126) form a crossover between the regions II and III. A trace 176*c* located on the layer 120*a* extends from the via 176*b* to a via 176*d*. A trace 176*e* located on layer 120*c* extends from the via 176*d* to a via 176*f*; in doing so, the trace 176*e* passes below the traces 174*c* and 175*a* of the conductors 124, 125 of pair 1, and also forms a crossover with the trace 173*e* of the conductor 123. As a result, the conductors 123, 126 form a crossover 186 that corresponds to the crossover of the conductors of pair 3 between regions III and IV shown in FIG. 1. A trace 176*g* travels on the layer 120*a* from the via 176*f* to a via 176*h*. A trace 176*i* located on the layer 120*f* extends from the via 176*h* to the aperture 56, in which is mounted the IDC 46. Therefore, the traces 176*a*, 176*c*, 176*e*, 176*g*, 176*i* and the vias 176*b*, 176*d*, 176*f*, 176*h* connect the fixed end segment 126*b* of the conductor 126 with the IDC 46.

Notably, the portions of the traces of the conductors between the crossover points 181, 183, 184, 187 and the crossover 186 include generally parallel segments that are all located on the same layer (layer 120*a*) of the wiring board 20, as do the portions of the traces following the crossover 183. These parallel portions correspond to regions III and IV of FIG. 1, thus enabling the compensation of crosstalk between the conductors as described above. Because the traces on a wiring board can typically be formed closer together than leadframe or contact wire-type conductors, they may be able to compensate crosstalk more efficiently (i.e., over a shorter length), which can assist in keeping the jack compact.

Those skilled in this art will appreciate that, although the illustrated embodiment includes a crossover of pair 3 in a floating PWB between the free and fixed ends of the contact wires and the remaining crossovers in the main wiring board, other configurations may also be employed. For example, the crossovers between Regions II and III (where all of the pairs include a crossover) may be achieved in a floating PWB also, or all of the crossovers for all of the regions may be achieved in a floating PWB. Alternatively, all of the crossovers for all of the regions may be achieved in the main wiring board. As another alternative, the crossovers between any of the regions may be achieved through lead frame and/or contact wires physically crossing each other. Other configurations may also be suitable for use with this invention.

As another example, the contact wires may mount in locations that do not follow the staggered mounting scheme illustrated herein (an exemplary alternative in which the contact wires have a "duo-diagonal" arrangement is illustrated in U.S. Pat. No. 6,196,880 to Goodrich et al). As a further example, the IDCs may mount in a different pattern on the wiring board, or some other type of connector may be used. Those skilled in this art will also recognize that embodiments of the wiring board described above may be employed in other environments in which a communications jack may be found. For example, jacks within a patch panel or series of patch panels may be suitable for use with such wiring boards. Other environments may also be possible.

The configuration illustrated and described herein can provide connectors, and in particular communications jacks, that exhibit improved crosstalk characteristics, particularly at elevated frequencies. For example, a connector such as that illustrated in FIGS. 1–8 and mated with a conventional plug may have channel alien NEXT of less than −60 dB power sum at 100 MHz, and less than −49.5 dB power sum at 500 MHz.

Further, those skilled in the art will recognize the reciprocity that exists between the differential to common mode crosstalk induced on a first pair, when a second pair is excited differentially, and the common mode to differential signal induced on the second of these pairs when the first of these pairs is excited common-modally, with the common mode to differential crosstalk equaling the differential to common mode crosstalk multiplied by a constant, that constant being the ratio of the differential to common mode impedances. Consequently, when an improvement occurs, due to the current invention, in the differential to common mode crosstalk between two pairs when one of these pairs is excited differentially, a corresponding improvement occurs in the common mode to differential crosstalk between these two pairs, when the other of these pairs is excited common-modally.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications connector, comprising:
    a dielectric mounting substrate;
    at least four pairs of conductors mounted on the mounting substrate, each of the conductors including a free end segment, each of the free end segments being positioned in side-by-side and generally parallel relationship;
    at least four pairs of terminals mounted on the mounting substrate, wherein each of the pairs of terminals is electrically connected to a respective pair of conductors;
    wherein a first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs;
    wherein each of the first, second and fourth pairs of conductors includes a crossover between the conductors of the pairs, and wherein the third pair of conductors includes three crossovers between its conductors.

2. The communications connector defined in claim 1, further comprising a wiring board positioned between the free end segments of the conductors and fixed end segments of the conductors mounted in the mounting substrate, the wiring board being generally perpendicular to the conductors, wherein the wiring board includes conductive traces that electrically connect the free end and fixed end segments of each of the conductors.

3. The communications connector defined in claim 2, wherein the wiring board is suspended above the mounting substrate by the conductors.

4. The communications connector defined in claim 2, wherein one of the crossovers in the third pair of conductors is created in the conductive traces in the wiring board.

5. The communications connector defined in claim 2, wherein the mounting substrate includes conductive traces that connect the fixed end portions of the pairs of conductors to respective terminals.

6. The communications connector defined in claim 5, wherein one of the crossovers in the third pair of connectors is created in the conductive traces on the mounting substrate.

7. The communications connector defined in claim 5, wherein the crossovers in the first, second and fourth pairs of connectors are created in the conductive traces on the mounting substrate.

8. The communications connector defined in claim 1, wherein a first one of the crossovers in the third pair of conductors occurs before the crossovers in the first, second and fourth pairs of conductors, a second one of the crossovers occurs at approximately the same location as the crossovers in the first, second and fourth pairs of conductors, and the third one of the crossovers in the third pair of conductors occurs after the crossovers in the first, second and fourth pairs of conductors.

9. The communications connector defined in claim 1, wherein the conductors define first, second, third and fourth regions, the first region being located in the free end segments of the conductors, the second region following a first of the three crossovers of the third pair, the third region following the crossovers of the first, second and fourth pairs and a second of the three crossovers of the third pair, and the fourth region following a third of the three crossovers of the third pair.

10. The communications connector defined in claim 9, wherein the arrangement of the conductors of the first, second, third and fourth pairs of conductors is such that the effective compensating lengths of the first, second, third and fourth regions are generally the same.

11. The communications connector defined in claim 2, wherein the fixed end segments of the conductors enter the wiring board in staggered locations.

12. A communications connector, comprising:
    a dielectric mounting substrate;
    at least four pairs of conductors mounted on the mounting substrate, each of the conductors including a free end segment, each of the free end segments being positioned in side-by-side and generally parallel relationship;
    at least four pairs of terminals mounted on the mounting substrate, wherein each of the pairs of terminals is electrically connected to a respective pair of conductors;
    wherein a first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free ends of the third pair being disposed between the first and second pairs, and the other of the conductor free end segments being disposed between the first and fourth pairs;
    further comprising a wiring board positioned between the free end segments of the conductors and fixed end segments of the conductors mounted in the mounting substrate, the wiring board being generally perpendicular to the conductors, wherein the wiring board includes conductive traces that electrically connect the free end and fixed end segments of each of the conductors; and
    wherein the third pair of conductors forms a crossover on the wiring board, and wherein the first, second and fourth pairs of conductors include a crossover, and wherein the third pair of conductors includes two additional crossovers.

13. The communications connector defined in claim 12, wherein the wiring board is suspended above the mounting substrate by the conductors.

14. The communications connector defined in claim 12, wherein the mounting substrate includes conductive traces that connect the fixed end portions of the pairs of conductors to respective terminals.

15. The communications connector defined in claim 14, wherein one of the crossovers in the third pair of connectors is created in the conductive traces on the mounting substrate.

16. The communications connector defined in claim 14, wherein the crossovers in the first, second and fourth pairs of connectors are created in the conductive traces on the mounting substrate.

17. The communications connector defined in claim 12, wherein a first one of the crossovers in the third pair of conductors occurs before the crossovers in the first, second and fourth pairs of conductors, a second one of the crossovers occurs at approximately the same location as the crossovers in the first, second and fourth pairs of conductors, and the third one of the crossovers in the third pair of conductors occurs after the crossovers in the first, second and fourth pairs of conductors.

18. The communications connector defined in claim 12, wherein the conductors define first, second, third and fourth regions, the first region being located in the free end segments of the conductors, the second region following a first of the three crossovers of the third pair, the third region following the crossovers of the first, second and fourth pairs and a second of the three crossovers of the third pair, and the fourth region following a third of the three crossovers of the third pair.

19. The communications connector defined in claim 18, wherein the arrangement of the conductors of the first, second, third and fourth pairs of conductors is such that the effective compensating lengths of the first, second, third and fourth regions are generally the same.

20. The communications connector defined in claim 12, wherein the fixed end segments of the conductors enter the wiring board in staggered locations.

21. A communications connector, comprising:
a dielectric mounting substrate;
at least four pairs of conductors mounted on the mounting substrate, each of the conductors including a free end segment, each of the free end segments being positioned in side-by-side and generally parallel relationship;
at least four pairs of terminals mounted on the mounting substrate, wherein each of the pairs of terminals is electrically connected to a respective pair of conductors;
wherein a first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs;
wherein the conductors define first, second, third and fourth coupling regions;
wherein the number of the first, second, third and fourth regions having positive differential to differential coupling equals the number of first, second, third and fourth regions having negative differential to differential coupling between the third pair and any of the first, second and fourth pairs; and
wherein the number of first, second, third and fourth regions having positive differential to common mode coupling equals the number of first, second, third and fourth regions having negative differential to common mode coupling between any two of the four pairs; and
wherein the third pair of conductors reverses polarity between the second and third regions.

22. A communications connector, comprising:
a dielectric mounting substrate;
at least four pairs of conductors mounted on the mounting substrate, each of the conductors including a free end segment, each of the free end segments being positioned in side-by-side and generally parallel relationship;
at least four pairs of terminals mounted on the mounting substrate, wherein each of the pairs of terminals is electrically connected to a respective pair of conductors;
wherein a first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs;
wherein the conductors define first, second, third and fourth coupling regions;
wherein the number of the first, second, third and fourth regions having positive differential to differential coupling equals the number of first, second, third and fourth regions having negative differential to differential coupling, and wherein the differential to differential coupling polarity of the first and fourth regions is identical and the differential to differential coupling polarity of the second and third regions is identical between the third pair and any of the first, second and fourth pairs; and
wherein the number of first, second, third and fourth regions having positive differential to common mode coupling equals the number of first, second, third and fourth regions having negative differential to common mode coupling between any two of the four pairs;
wherein each of the first, second and fourth pairs of conductors includes a crossover between the conductors of the pairs and wherein the third pair of conductors includes at least two crossovers between its conductors.

* * * * *

UNITED STATES PATENT AND TRADEMARK OFFICE
CERTIFICATE OF CORRECTION

| | | |
|---|---|---|
| PATENT NO. | : 7,186,149 B2 | Page 1 of 1 |
| APPLICATION NO. | : 11/230442 | |
| DATED | : March 6, 2007 | |
| INVENTOR(S) | : Hashim | |

It is certified that error appears in the above-identified patent and that said Letters Patent is hereby corrected as shown below:

<u>Column 16,</u>
Line 16, Please correct "." to read --;--
Line 16, Please add -- wherein each of the first, second and fourth pairs of conductors includes a crossover between the conductors of the pairs and wherein the third pair of conductors includes at least two crossovers between its conductors. --

Signed and Sealed this

Fifteenth Day of May, 2007

JON W. DUDAS
*Director of the United States Patent and Trademark Office*